United States Patent [19]

Groth

[11] 3,999,039
[45] Dec. 21, 1976

[54] RESISTANCE HEATED VAPORIZER
[75] Inventor: Rolf Groth, Witten, Germany
[73] Assignee: Flachglas Aktiengesellschaft Delog-Detag, Furth, Germany
[22] Filed: Dec. 17, 1974
[21] Appl. No.: 533,621
[30] Foreign Application Priority Data Dec. 22, 1973  Germany ............................ 2364379

[52] U.S. Cl. .............................................. 219/275
[51] Int. Cl.² ........................................ C23C 13/12
[58] Field of Search ........................... 118/48–49.5; 219/271, 275; 427/50–52, 78, 91, 99, 109, 124, 248–252

[56] References Cited
UNITED STATES PATENTS

| 2,100,045 | 11/1937 | Alexander | 118/49 X |
| 2,902,525 | 9/1959 | Barker | 219/275 UX |
| 3,092,511 | 6/1963 | Edelman | 118/48 X |
| 3,198,167 | 8/1965 | Bakish | 118/48 |
| 3,514,575 | 5/1970 | Hall et al. | 219/275 |
| 3,636,302 | 1/1972 | Porta et al. | 118/48 X |

FOREIGN PATENTS OR APPLICATIONS 970,246  8/1958  Germany ............................ 118/49

OTHER PUBLICATIONS

IBM Technical Disclosure Bulletin, "Evaporant Source" Howell et al., vol. 9, No. 12 (May, 1967), p. 1677.
IBM Technical Disclosure Bulletin, "Vapor Deposition Thickness Uniformity Control" Menz et al., vol. 13, No. 1, (June, 1970), p. 115.

Primary Examiner—Morris Kaplan

[57] ABSTRACT

A resistance-heated vaporizer for vacuum depositing thin metallic coatings on glass panes or the like is disclosed with at least one metal strip that is placed in spaced parallel relationship to the pane and connected to a source of electricity and with at least one relatively flat pocket provided on the metal strip facing the pane. The pocket is made of an electrically conductive and net-like material.

19 Claims, 4 Drawing Figures

RESISTANCE HEATED VAPORIZER

BACKGROUND

The invention relates to a resistance heated vaporizing apparatus for the vacuum depositing of thin coatings, especially of metal, onto vertically disposed objects of large surface area, such as sheets of glass or plastic.

Such vaporizers are used preferably for the uniform coating of large surfaces in large industrial vaporizing installations. In one known process for the vapor depositing of thin coatings onto sheets of glass or plastic in vacuo, which is used in the manufacture of heat reflecting glass panes, a plurality of vaporizing sources are disposed in a vertical plane in the form of a vaporizing field. The surfaces to be coated, such as large sheets of glass or plastic for example, are disposed in equidistant parallel planes on both sides of this vaporizing field.

As previously stated, large industrial vapor depositing installations of this kind are used primarily for the depositing of a heat reflecting metal coating from a vapor onto large glass sheets, in conjunction in some cases with adhesive and/or interference coatings. It is primarily a coating of gold that is deposited as the heat reflecting layer, such gold coated glasses being used for protection against sunlight both in the glazing of buildings and in the glazing of motor vehicles.

For the vacuum depositing of gold, tungsten coils can be used. A known vaporizing coil of this kind consists of a round tungsten rod with tungsten wire spirally wound thereon as described, for example, in B. L. Holland, "Vacuum Deposition of Thin Films," Chapman & Hall Ltd., London, 1963, pages 115 to 117. The gold in wire form is wound into the gaps between the turns of the vaporizing coil. When the vaporizing coil is heated by electrical resistance heating, the molten gold runs uniformly in the gaps so that the vaporization takes place uniformly on all sides. Accordingly, with vaporizing coils of this kind, gold coatings of equal thickness can be produced in a repeatable manner.

A disadvantage of the use of gold, especially in the vapor coating of large surfaces, consists in the high material costs. Appreciable savings of manufacturing costs can be achieved in this regard by replacing the gold coating with a silver coating, which has virtually the same protective action against sunlight. The advantages of replacing the gold coating with a silver coating have been described.

In the vaporization of silver by means of the vaporizing coils described above, the difficulty arises that tungsten is not wetted by silver. Instead, drops of silver depending from the turns of the tungsten coil are formed, and the vaporization characteristic is no longer uniform and reproducible. The use of other known vaporizer materials, such as molybdenum, tantalum or niobium, in the vaporizing coils brings no improvement in this respect. The use of tantalum and niobium does substantially prevent the formation of depending drops of silver, but even so the silver does not run uniformly in the interstices, so that vaporization towards both sides of the vaporization field is uneven and is not repeatable from batch to batch. On account of the variation of the vaporization characteristics from batch to batch, repeatable coating thicknesses cannot be achieved with vaporizing coils.

Other known vaporizing devices, such as shuttle vaporizers, are not suitable for the vapor coating of vertically disposed surfaces because the current of the vaporizing material from such devices flows upwardly. On the other hand, the horizontal arrangement of large sheets in big industrial vapor coating installations entails such great difficulties as to make it unfeasible.

THE INVENTION

The invention is addressed to the problem of creating a vaporizer of the kind described in the beginning, which will permit the uniform vacuum coating even of large sheet materials with materials of poor wetting qualities, especially silver.

This problem is solved in an apparatus of the described kind by at least one strip of sheet metal disposed at a distance from the surface to be coated and having its broad lateral surface disposed parallel to said surface, and connected at its longitudinal ends to the electrical voltage source serving for the resistance heating, at least one shallow pocket of metallic mesh being affixed in an electrically conductive manner to the lateral surfaces of said strip which face the surfaces to be coated.

A preferred embodiment of the invention, for the simultaneous vapor coating of two sheets disposed in a parallel, spaced relationship to one another with the vaporizing device being disposed in the interval between the two sheets at an equal distance from each, is characterized in that at least one shallow mesh pocket is applied to each of the surfaces of the sheet metal strip facing the sheets to be coated. Furthermore, a vaporizing device for coating large-area sheets in large industrial vapor coating installations is proposed, in which a plurality of sheet metal strips with attached mesh pockets is provided in one plane for the formation of a vaporization field.

The invention thus creates a reliably operating vaporizing source is provided, whose vaporization is in a horizontal direction, by means of which two confronting, vertically disposed surfaces can be coated in a repeatable manner. These vaporizing devices are used preferably in a vaporizing field using a large number of them for the coating of large areas.

A further development of the invention provides for the sheet metal strip or strips to be disposed with horizontal longitudinal edges.

In the vaporizing device constructed in accordance with the invention, the sheet metal strip generally consists of a material which also is otherwise used for the preparation of vaporization sources, especially metals of high melting point, such as tungsten, molybdenum, tantalum or niobium. The strip is connected at both ends by contact surfaces to a power source. In the middle portion of the strip, the mesh pockets are provided on the above-described vaporizer materials in the form of a shallow pocket. The metal strip and the mesh pockets can be joined together by welding the wires of the mesh with a spot welding machine. However, other methods, such as electron beam welding or the like, can also be used.

As previously mentioned, the vaporizing device can preferably be so disposed that the opening of the mesh pocket faces upwardly, in order to make it as easy as possible to charge it with the material to be vaporized, which may be in the form of wires, or in the form of a sheet metal strip, or also in granular form. Of course, the sheet metal strip and with it the vaporizing source can be turned 90°, as mentioned before, in which case the vaporizing material would have to be charged from the side. In comparison to the known tungsten coils, the vaporizing device of the invention has the advantage that the amount of work involved in charging is substantially less. While in the case of the tungsten coils the wire to be vaporized had to be wound into the individual windings of the coils, in the case of the mesh vaporizer of the invention the material to be vaporized merely has to be dropped in. Another advantage consists in the fact that, as stated, vaporizing material in strip form or granular form can also be used. For this reason the new vaporizing device proposed in accordance with the invention is suitable not only for the vaporization of metals of poor wetting qualities such as silver or copper, but also it offers appreciable advantages over tungsten coils for the vaporization of gold, due to the small amount of work involved in charging. This is very advantageous especially in the case of large area coating in which a plurality of individual vaporizing sources are arranged in a vaporizing field in a large industrial vaporizing installation.

In addition, vaporizing devices of the kind proposed by the invention can be used for the vaporization of dielectric materials in granular form. Another interesting application is to be found in the vaporization of chromium which sublimates at a temperature below its melting temperature. Tungsten coils are not suitable for the vaporization of chromium since chromium cannot be prepared in the form of wire. Chromium, however, in granular form, in the form of strips, or in the form of flakes pressed from granules, can easily be vaporized from the mesh vaporizers proposed by the invention.

The above-described general application possibilities for the new vaporizing device forms an important part of the idea of the invention.

In order to assure that the mesh pocket material will also be heated sufficiently to prevent undesirable condensation of the vaporized material thereon it has proven desirable for the conductivity of the mesh material of each pocket to amount to at least 20%, preferably more than 30%, of the total conductivity of the sheet metal strip in the area of the mesh pocket.

Since it has been found that in this case the sheet metal strip assumes an excessively high temperature outside of the area of the mesh pocket if the said mesh pocket area is brought to the required vaporization temperature and the sheet metal strip has the same cross section all through its length, it is furthermore proposed in accordance with the invention that the electrical conductivity of the sheet metal strip or strips in the area of the mesh pocket or pockets be reduced by making the cross section smaller in that area than it is in those areas of the sheet metal strip which are outside of the mesh pocket or pockets.

This can be accomplished either by providing a "waist" of reduced cross section in the sheet metal strip or strips in the area of the mesh pocket or pockets by cutting notches therein extending from the longitudinal edges of the strip or strips towards the longitudinal centerline thereof and having preferably a substantially trapezoidal shape with the legs of the trapezoid extending from the lateral boundary of the pocket to the longitudinal edge of the uncut portions of the strip, or by making the sheet metal strip thicker in the area outside of the mesh pockets.

It is furthermore proposed in accordance with the invention that an expansion fold being provided in at least one area of the strip outside of the mesh pocket. This has the advantage of preventing any breaking or distortion of the sheet metal strip during the electrical resistance heating, because the expansion folds will completely compensate for the thermal expansion of the strip.

Additional features and advantages of the invention will appear in the claims and in the following description wherein embodiments are explained in detail with the aid of the appended drawing in which FIG. 1 is a perspective view of a first embodiment of the vaporizing device of the invention;

Figure 1:
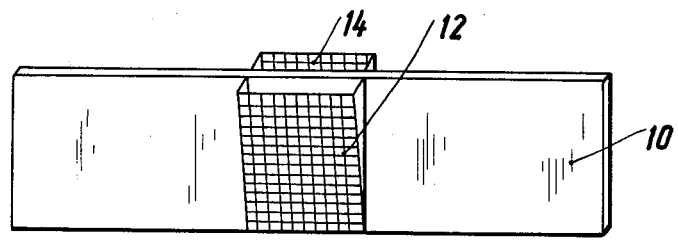

The vaporizing device shown in FIG. 1 has a relatively elongated strip 10 of sheet tantalum to which shallow mesh pockets 12 and 14 are fastened by spot welding approximately at the center of its length, the opening of said pockets facing upward in the drawing. Both the sheet metal strips 10 and the mesh pockets 12 and 14 consist in this embodiment of tantalum. In the preferred use of the vaporizing device of the invention in large industrial vaporizing installations for the vapor coating of upright sheets of glass facing each other in paralell spaced relationship, the sheet metal strip in the form shown in FIG. 1 is centrally disposed between the two sheets of glass and its longitudinal edges are disposed horizontally. Preferably, a plurality of the sheet metal strips 10 with mesh pockets 12 and 14, as shown in FIG. 1, are disposed in a vertical plane centrally located between the two sheets being coated, so as to form a vaporization field. The tantalum sheet metal in the embodiment represented in FIG. 1 has a thickness of 0.1 mm and a width of 12 mm, while the length is 5 cm. The extremities of the tantalum strip are connected by contact surfaces to a power source. The tantalum pocket from which the mesh pockets 12 and 14 are made has, in the embodiment shown, a fineness of 100 meshes per $cm^2$, the wire thickness being 0.2 mm. The separation between the top edge of the mesh pocket and the metal strip amounts to about 2 mm in the embodiment represented in FIG. 1.

The embodiment of the vaporizing device of the invention which is shown in FIG. 1 can be used for the vacuum deposition of thin coatings by dropping the material for the coating, such as silver for example, in wire, flat or granular form, into the opening of the mesh pockets 12 and 14 and then vaporizing it by applying the electrical voltage used for resistance heating to the two ends of the sheet metal strip 10.

Whereas in the embodiment shown in FIG. 1 only two mesh pockets 12 and 14 are disposed on opposite sides of the sheet metal strip 10, provision can, of course, be made for the arrangement of a plurality of pairs of mesh pockets of a sheet metal strip which would then be longer. Also, instead of tantalum, some other high-melting metal can be used, such as tungsten, molybdenum or niobium, for the strip 10 and/or the pockets 12 and 14. Tantalum has proven especially suitable, however, as a material for the vapor source shown, because it can easily be worked and because spot welding between the wires of the mesh of pockets 12 and 14 and the sheet metal strip 10 is very strong. However, other methods such as electron beam welding or the like can also be used.

As previously explained, the vapor source shown in FIG. 1 is preferably arranged so that the opening of the mesh pockets 12 and 14 is facing upward to facilitate charging them with the material to be vaporized, which may be in the form of wire, strip or granules. The vapor source can also be turned 90° from the position shown in FIG. 1, in which case the vapor material would have to be inserted into pockets 12 and 14 from the side. Obviously in that case the plane of strip 10 would then be parallel to the plane of the sheet materials being coated.

Figure 2:
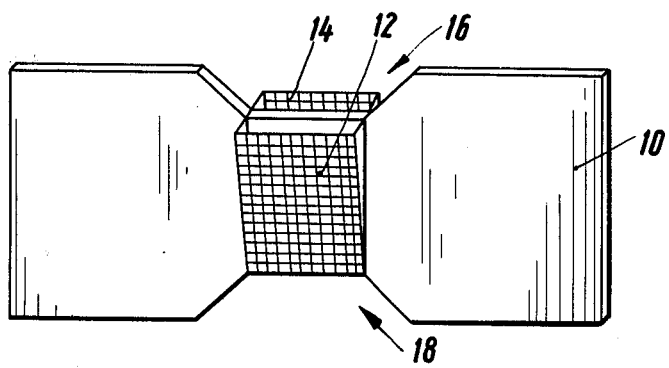
FIG. 2 is a perspective view of the same kind as in FIG. 1 of another embodiment.

FIG. 2 illustrates an embodiment which is a variation of the one shown in FIG. 1. In this embodiment the sheet metal strip 10 does not have the same cross section over its entire length. Instead, in the area of the mesh pockets 12 and 14 it has a constriction which is made by cutting notches 16 and 18, one on each of the two longitudinal edges. These notches 16 and 18 are of trapezoidal shape, the legs of the trapezoid extending from the margins of the mesh pockets 12 and 14, as shown, diagonally outwardly to the remaining longitudinal edges of the sheet metal strip 10. The cross sectional reduction of the strip 10 in the area of the mesh pockets 12 and 14, which is thus accomplished, and the corresponding widening of the strip outside of the pocket area, in comparison with the dimensions represented in the embodiment illustrated in FIG. 1, has the purpose of reducing the electrical resistance of strip 10 in the area outside of the two pockets 12 and 14 and reducing the temperature in this area below the temperature in the area of the pockets, for it has been found that the electrical resistances in the pockets 12 and 14 in the direction of current flow, i.e., lengthwise of the sheet metal strip 10, must not exceed a certain value in comparison with the electrical resistance of the section of the sheet metal strip between the mesh pockets. If the electrical resistance in the pockets is very high, so that only a very small proportion of the heating current flows through them and thus only the portion of strip 10 that is located between the mesh pockets is directly heated, the temperature of the pockets 12 and 14, which are heated only by the thermal conduction of the junctions between the pocket mesh and the strip and by radiation from the portion of strip 10 located between the pockets 12 and 14, will remain substantially below the temperature of the section of the strip between the mesh pockets. This has the disadvantage that vapor material vaporized by the strip will condense on the wires of the pockets and will be revaporized therefrom only so slowly that the total vaporizing time will be appreciably prolonged. To avoid this, an additional direct heating of the mesh pockets by an appreciable flow of current through the mesh thereof is necessary. This current flowing through each mesh, and hence the corresponding conductivity of the mesh pockets 12 and 14, should amount to at least 20%, preferably over 30%, of the current and of the electrical conductivity of the section of the strip 10 located between the mesh pockets. If the electrical conductivities are so proportioned, and if the cross sectional reduction of the sheet metal strip 10 in the area of the mesh pockets 12 and 14 as illustrated in FIG. 2 is not undertaken, the total current flowing through the strip outside of the pocket area will of course result in an especially great temperature rise outside of the pocket area, and thus in temperatures higher than those in the area of the mesh pockets 12 and 14. This is undesirable, because the life of a vaporizer of this kind is determined by the zone of maximum temperature. For as the temperature increases the rate of recrystallization of the sheet metal strip material increases, increasing the danger of breakdown, so that the temperature of a vaporizer should at no point be higher than in that area in which the vapor producing material is actually vaporized.

Now, in the embodiment represented in FIG. 2, the electrical resistance of the sheet metal strip 10, as stated previously, is diminished outside of the area of mesh pockets 12 and 14 by the relative widening of the strip achieved by means of the notches 16 and 18, bringing it about that the temperature of the strip 10 outside of the area of the pockets 12 and 14 will not be substantially higher than it is in the mesh pocket area where the actual vaporization takes place.

Figure 3:
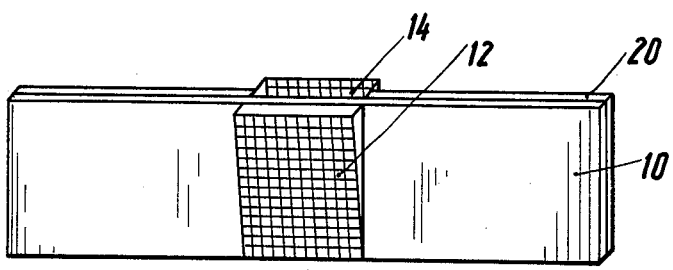
FIG. 3 is a perspective view of the same kind as in FIGS. 1 and 2 of a third embodiment.

In FIG. 3 there is shown another, especially preferred embodiment in which the thickness of the sheet metal strip in the area outside of the vaporization zone is increased so that the electrical resistance of the strip in that area is reduced. The increase of the thickness of the sheet metal outside of the area of the mesh pockets 12 and 14 is achieved by welding a second strip of sheet metal 20 onto the through-going strip 10 outside of the area of the pockets 12 and 14.

Figure 4:
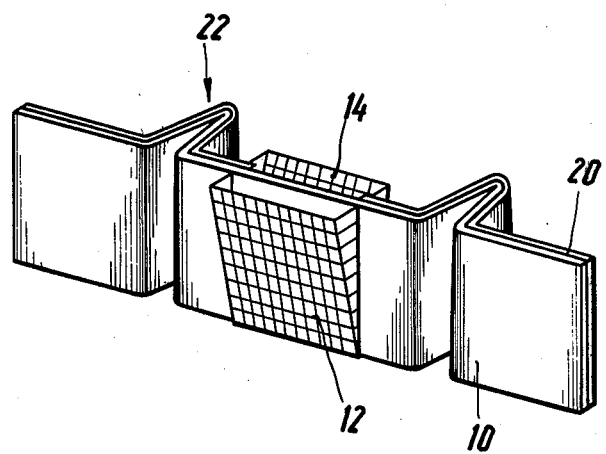
FIG. 4 is a perspective view of an embodiment similar to that of FIG. 3, in which expansion folds are provided.

In FIG. 4 there is shown an embodiment of the invention in which the sheet metal strip has an expansion fold 22 on each side of the mesh pockets 12 and 14, which completely takes up the thermal expansion which occurs during the resistance heating.

The mesh pocket can, of course, be replaced by a sieve, that is, a perforated plate. In either case the vaporization in the direction of the materials in sheet form which are to be coated is more uniform than it is in vaporizers of the prior art.

The manner of the operation of the preferred embodiment of the invention shown in FIG. 3 will now be explained with the aid of an example.

EXAMPLE

In the middle of a tantalum strip 0.1 mm thick and 12 mm wide a tantalum mesh measuring 12 mm × 12 mm was spot welded to each side. The tantalum mesh contained 100 meshes per square centimeter, its wire thickness being 0.2 mm. The distance between the mesh pockets 12 and 14 in the area of the opening at the top and the metal strip was approximately 2 mm. In the area outside of the mesh pockets 12 and 14 the strip 10 was thickened by welding another 0.1 mm thick tantalum strip 20 thereon. The two mesh pockets 12 and 14 were then filled to about ⅔ of their depth with silver wire. When the vaporizer was heated in a vacuum coating installation, the silver wire, upon reaching the melting temperature, began to melt first at the points of contact with the tantalum strip. After all of the silver had melted, molten droplets formed between the strip and the mesh, which were vaporized upon the attainment of the vaporization temperature of about 1200° C.

In a number of experiments the vaporizing device produced an equal, repeatable vaporization characteristic on both sides, that is to say, in both directions perpendicular to the plane of the drawing in FIG. 3. The vaporization characteristic which was obtained is quite equal to that of a Knudsen vaporizer—that is, the amounts vaporizing in different directions are proportional to the angle between the surface normals of the tantalum strip 10, or 10 and 20, and the vaporizing device.

It has been found to be especially desirable to limit the filling of the vaporizer or mesh pockets 12 and 14 to approximately two-thirds of the pocket depth. In this manner molten drops of the vaporizing material are prevented from forming in the area directly below the upper margin of the pocket. The vaporization of such molten drops would occur largely from the opening without being screened by the mesh, so that upward vaporization would be intensified, which is detrimental to the uniform coating of large sheets of material. But if the charge is limited to about ⅔ of the depth of the pocket the trouble is virtually negligible.

The features contained in the above description, in the drawing and in the appended claims can be important both individually and in any desired combination for the realization of the invention in its various embodiments.

I claim:
1. A resistance-heated vaporizer for vacuum-depositing thin coatings on a flat substantially vertically extending surface, especially for depositing thin metallic coatings on panes of glass or synthetic material, comprising: at least one metal strip having a wide side face and to be placed in spaced relationship to the surface to be coated so that said side face extends parallel to said surface, said strip having end portions to be connected to a source of electricity, and at least one relatively flat pocket provided at said side face, said pocket being electrically conductively connected to said strip and being made of a metallic net-like material and open at the top thereof.

2. A resistance-heated vaporizer according to claim 1, comprising at least two flat pockets, one each on opposite sides of said strip, whereby said vaporizer may simultaneously coat two surfaces respectively located on opposite sides of said strip.

3. A resistance-heated vaporizer according to claim 1, comprising a plurality of metal strips arranged in a plane and each provided with at least one said relatively flat pocket.

4. A resistance-heated vaporizer according to claim 1, wherein the electrical conductivity of said net-like material of each pocket is at least 20% of the conductivity of each said strip in the vicinity of said pocket.

5. A resistance-heated vaporizer according to claim 1, wherein the electrical conductivity of said net-like material of each pocket is more than 30% of the conductivity of each said strip in the vicinity of said pocket.

6. A resistance-heated vaporizer according to claim 4, wherein the cross-section of each said strip in the vicinity of each said pocket is reduced with respect to the remaining areas of said strip to thereby increase the electrical conductivity of said strip in the vicinity of said pocket.

7. A resistance-heated vaporizer according to claim 6, wherein the area of said side face of each said metal strip is reduced in the vicinity of each said pocket and the cross-section of said metal strip is reduced at each said pocket.

8. A resistance-heated vaporizer according to claim 7, wherein said reduced area of said side face of each said metal strip is formed by notches extending from the edge of said metal strip towards the longitudinal central plane thereof.

9. A resistance-heated vaporizer according to claim 8, wherein said notches have a substantially trapezoidal cross-section, the edges of said strip extending from the side of each said pocket to the edge of each said strip outside the vicinity of said pocket forming the sides of a trapeze.

10. A resistance-heated vaporizer according to claim 7, wherein said reduced area results from each said strip having a larger cross-section outside the vicinity of each said pocket than in the vicinity of each said pocket.

11. A resistance-heated vaporizer according to claim 1, wherein each said strip is provided with an expansion fold in at least one of the areas outside the vicinity of each said pocket.

12. A resistance-heated vaporizer according to claim 1, wherein each said metal strip is made of a material having a high melting point.

13. A resistance-heated vaporizer according to claim 12, wherein said metal is selected from the group consisting of tungsten, molybdenum, tantalum and niobium.

14. A resistance-heated vaporizer according to claim 1, wherein each said pocket is made of a material having a high melting point.

15. A resistance-heated vaporizer according to claim 14, wherein said material is selected from the group consisting of tungsten, molybdenum, tantalum and niobium.

16. A resistance-heated vaporizer according to claim 1, wherein each said pocket is weleded to the respective strip.

17. A resistance-heated vaporizer according to claim 16, wherein said pocket is spot-welded to said strip.

18. A resistance-heated vaporizer according to claim 17, wherein said pocket is welded to said strip by electron-beam welding.

19. A resistance-heated vaporizer according to claim 1, wherein each said metal strip is arranged in a substantially vertical plane.

* * * * *